US006833583B2

(12) United States Patent
In't Zandt et al.

(10) Patent No.: US 6,833,583 B2
(45) Date of Patent: Dec. 21, 2004

(54) EDGE TERMINATION IN A TRENCH-GATE MOSFET

(75) Inventors: Michael A. A. In't Zandt, Veldhoven (NL); Erwin A. Hijzen, Blanden (BE); Raymond J. E. Hueting, Helmond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 95 days.

(21) Appl. No.: 10/238,795

(22) Filed: Sep. 10, 2002

(65) Prior Publication Data

US 2003/0047777 A1 Mar. 13, 2003

(30) Foreign Application Priority Data

Sep. 13, 2001 (GB) .............................................. 0122121

(51) Int. Cl.[7] .......................... H01L 29/76; H01L 29/94; H01L 31/062; H01L 23/58
(52) U.S. Cl. ........................ 257/329; 257/330; 257/331; 257/488
(58) Field of Search ................................... 257/329, 330, 257/331, 488, 492, 493; 438/270

(56) References Cited

U.S. PATENT DOCUMENTS

| 5,316,959 A | * | 5/1994 | Kwan et al. ................. 438/270 |
| 5,385,852 A | | 1/1995 | Oppermann et al. .......... 437/40 |

FOREIGN PATENT DOCUMENTS

| GB | 2080616 A | 5/1981 | ........... H01L/29/60 |
| WO | WO0108226 | 2/2001 | ........... H01L/29/78 |

* cited by examiner

Primary Examiner—Steven Loke
(74) Attorney, Agent, or Firm—Aaron Waxler (57) ABSTRACT

To avoid premature breakdown at the edge of the active area of RESURF trench-gate MOS device, an edge field plate (24) can be placed with a connection to the gate and a second spaced field plate (24) in the same trench (12). The gate trench network (12) could be either formed by hexagon unit cells or by square unit cells. Since the RESURF condition requires a small cell pitch, self-aligned processing could be used.

7 Claims, 7 Drawing Sheets

EDGE TERMINATION IN A TRENCH-GATE MOSFET

BACKGROUND OF THE INVENTION

This invention relates to a cellular trench-gate FET and to a method of forming the same.

A previous application of the present applicant, WO 01/08226, the contents of which are incorporated herein by reference, describes an edge termination in a cellular trench-gate MOSFET device. It is known to have a cellular trench-gate MOSFET having a semi-conductor body having an array of transistor cells, in which the cells are bounded by a pattern of trenches lined with dielectric material within the array and around the perimeter of the array. The array trenches extend from a surface of the body through a body region of a first conductivity type into an underlying drain drift region of an opposite second conductivity type. The dielectric material in the array trenches provides a gate dielectric layer adjacent to the body region. A gate electrode on the gate dielectric layer provides a trench-gate in the array trenches, for controlling current flow in a conduction channel from a source region at the surface of the body to the drain drift region in a conductive state of the transistor. A depletion layer is formed in the drain drift region from the p-n junction with the body region and from the trench-gate in a blocking state of the transistor. Premature breakdown of these transistors can occur at high field points in the depletion layer, especially at the perimeter of the array.

WO 01/08226 addressed the problem of premature breakdown of such transistors by providing a field plate on dielectric material in a perimeter trench. The dielectric material formed a thicker dielectric layer than the gate dielectric layer in the array trenches. The field plate was connected to the source or trench-gate of the transistor and acted inwardly towards the cellular array rather than outwardly towards the body perimeter, because of its presence on the inside wall of the trench without acting on any outside wall. That arrangement reduced the risk of premature breakdown that can occur at high field points in the depletion layer, especially at the perimeter of the cellular array.

SUMMARY OF THE INVENTION

It is an object of the present invention to make further improvement in relation to breakdown voltage beyond those achieved by WO 01/08226.

According to a first aspect of the present invention a cellular trench-gate field-effect transistor comprises a semiconductor body having an array of transistor cells, the cells being bounded by a pattern of perimeter trenches lined with dielectric material around the perimeter of the array, the perimeter trench having an inner wall closer to an active area of the transistor and an outer wall closer to the edge of the transistor, characterised in that each of said inner and outer walls has a field plate located on the dielectric material and the field plate on the inner wall of the perimeter trench is connected to a source or trench-gate of the transistor.

The field plate on the outer wall may be floating in potential.

The breakdown voltage of the transistor is thereby beneficially increased.

The perimeter trench may include dielectric material between the field plates on the inner and outer walls.

Each of said perimeter trenches has a field plate on said inner wall, and may have a field plate on said outer wall.

Preferably, the transistor is a trench-gate MOSFET. Preferably, the transistor is manufactured by a self-aligned process, giving a self-aligned transistor.

The field plates are preferably formed of polysilicon or may be formed of metal.

The perimeter trenches may have thicker dielectric than gate dielectric in an active area of the transistor.

Preferably, the transistor cells are hexagon cells or square cells. Preferably, the perimeter trenches are in the shape of hexagon cells or square cells.

Preferably, the inner wall field plate is connected to the trench gate.

According to a second aspect of the present invention a method manufacturing a trench-gate field-effect transistor comprises:

forming an array of transistor cells on a semiconductor body;

forming a pattern of perimeter trenches around the perimeter of the array of transistor cells;

lining the perimeter trenches with dielectric material;

characterised by forming an inner field plate on an inner wall of the perimeter trench closer to the array and forming an outer field plate on an outer wall of the perimeter trench closer to an edge of the transistor; and connecting the inner field plate to a source or trench-gate of the transistor.

Preferably, steps d) and e) are performed in a self-aligned manner.

Preferably, step d) is performed by depositing a conductive layer, which may be polysilicon, in the perimeter trenches preferably followed by etching said conductive layer anisotropically to remove the conductive layer from the bottom of the perimeter trench and from the upper face of the pattern of perimeter trenches.

The conductive layer is thereby advantageously left on the sidewalls of the perimeter trench.

Material for the trench-gate and trench connection layer may be deposited in the perimeter trenches and over an upper face of the pattern of perimeter trenches and may be subsequently etched away from the perimeter trenches to be replaced with a conductive layer, which is preferably thinner than the previous layer, that provides the inner and outer field plates.

All of the features disclosed herein may be combined with any of the above aspects in any combination.

BRIEF DESCRIPTION OF THE DRAWING

A specific embodiment of the present invention will now be described, by way of example, and with reference to the accompanying drawings, in which.

DESCRIPTION OF THE PREFERRED EMBODIMENTS

In the so-called RESURF technique, also known as reduced surface field technique, in trench MOSFET devices edge termination is a problem, because of low breakdown voltages. To avoid premature breakdown at the edge of the active area of a MOSFET device, an edge field plate has been suggested, which edge field plate is connected to the gate, as described in WO 01/08226. In order to use the RESURF condition a small cell pitch is required, in order to achieve this a self-aligned processing could be used, although there are other options to obtain smaller cell pitches.

The following describes a method of fabricating an edge field plate in a self-aligned RESURF trench-gate MOS process. The RESURF trench-gate MOSFET is similar to that described in WO 01/08226 in that the device is formed in a silicon substrate comprising a low-doped drain drift region 14 on a a high-doped drain electrode region 43. Further clarification as to the role of the low doped drift region 14 in the RESURF action can be obtained from WO 01/08226.

First, a relatively thick, for example 500 nanometers, thermal oxide layer 10 is grown after which it is patterned and etched into a hard mask to define a trench network. In this example the trench network consists of a hexagonal (as shown in the diagrams) or square trench network. Then the trench network is etched followed by an oxide deposition, for example 200 nanometers oxide for 200V devices with a trench width greater than 400 nanometers.

Then, the trenches are covered with a relatively, thick oxide, after which they are filled with polysilicon 16. This polysilicon layer 16 has to be thick enough to fill the trenches, and also thick enough to keep some of the polysilicon left, as a bond path for gate connection, when it will be etched back together with a second polysilicon layer later in the process.

Figure 1:
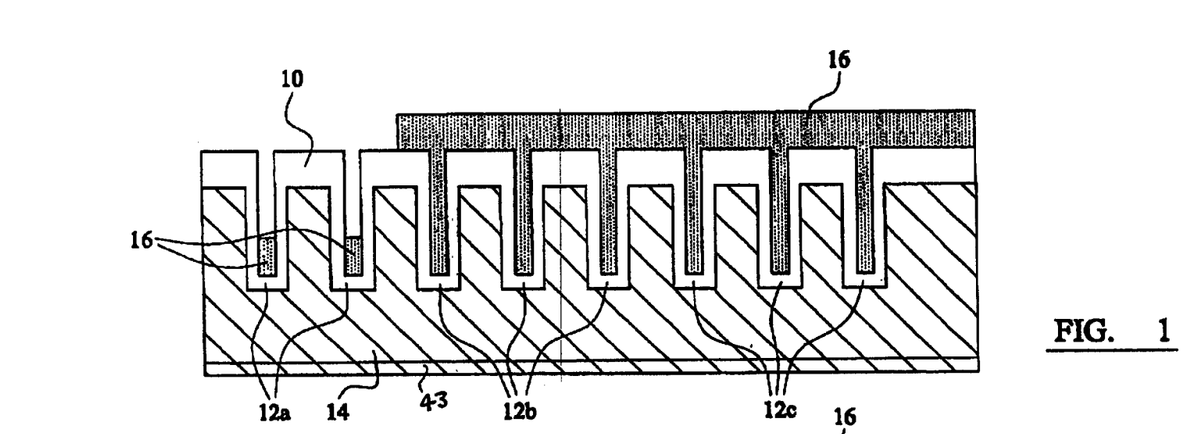
FIG. 1 is a schematic cross-sectional side view of a first stage in the production of a first embodiment of the invention.

After that, the polysilicon layer is etched back with a mask down to the depth at which a P-body profile will be diffused later in the process. This stage in the process is shown in FIG. 1, which shows a thermal oxide layer 10 defining a network of trenches 12a, b, c laying on a silicon substrate 14. Polysilicon 16 is located in the base of the two trenches 12a (to form trenches in an active area) at the left hand of FIG. 1 and entirely fills the trenches 12b/c (to form trenches beneath a bondpad and termination trenches with field plates respectively, as described below) at the right hand side of FIG. 1 with a polysilicon layer 16 overlaying those right hand trenches 12b/c.

Subsequently, the thick thermal oxide 10 in the trenches 12a is etched away with a wet etch and gate oxide is grown.

Figure 2:
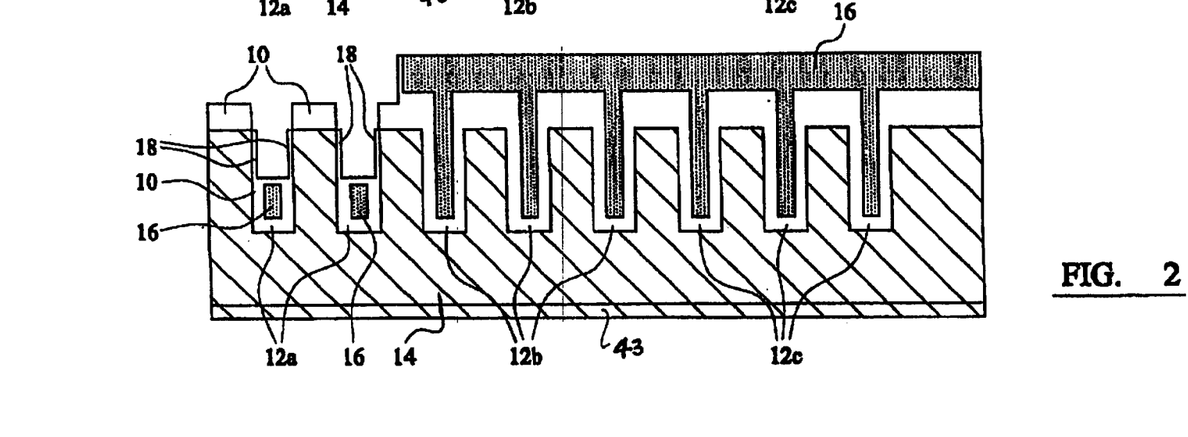
FIG. 2 is a similar view to FIG. 1 showing a schematic side view of a second stage in the production of the first embodiment.

Then, an anisotropic oxide etch is used to etch the parts of the gate oxide which are on top of the polysilicon 16. Consequently, only at the sidewalls 18 of the left hand trenches 12a does gate oxide 10 remain, as shown in FIG. 2.

Figure 3:
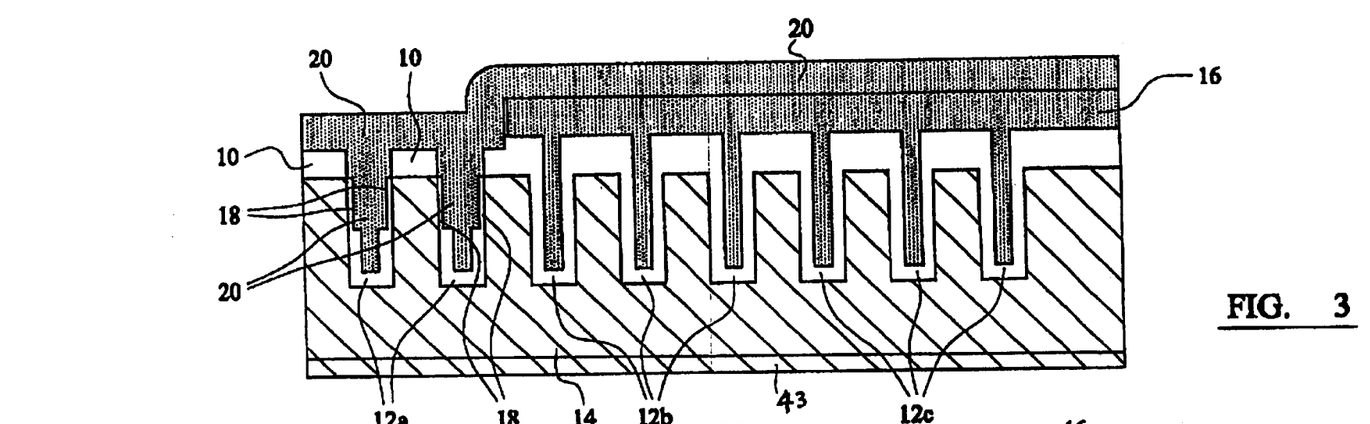
FIG. 3 shows a schematic side view of a third stage in the production of the first embodiment.

After this a second polysilicon layer 20, as shown in FIG. 3, is deposited to fill the two left hand trenches 12a and cover the first polysilicon layer 16.

Figure 4:
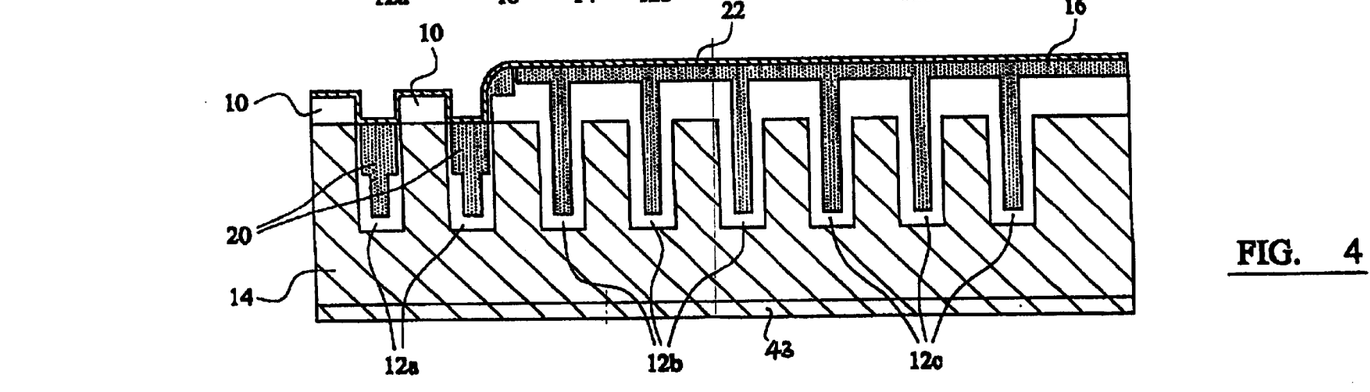
FIG. 4 shows a schematic side view of a fourth stage in the production of the first embodiment.
Figure 9:
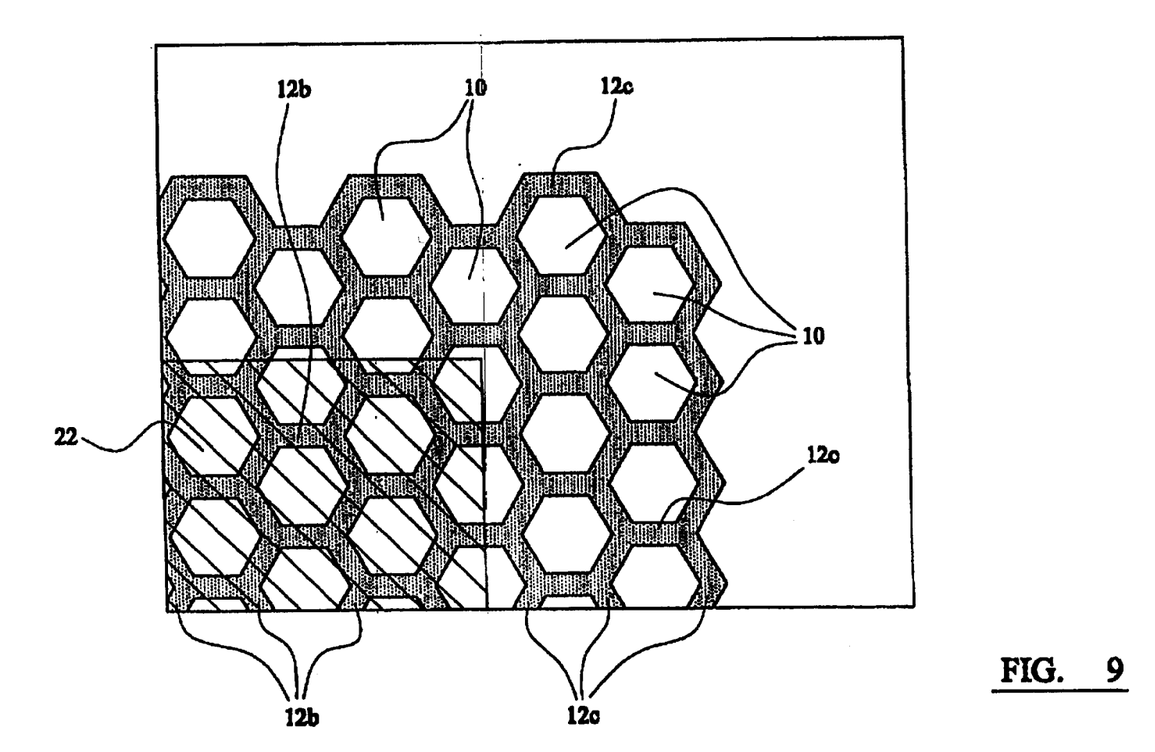
FIG. 9 is a schematic view from above showing the fourth stage in the production of the first embodiment.

The second polysilicon layer 20 is then etched back down to the interface between the silicon 14 and the first layer of thick oxide 10, as shown in FIG. 4, with top views being shown in FIG. 9. Subsequently, a relatively thin nitride layer 22 is deposited, also as shown in FIG. 4.

Figure 5:
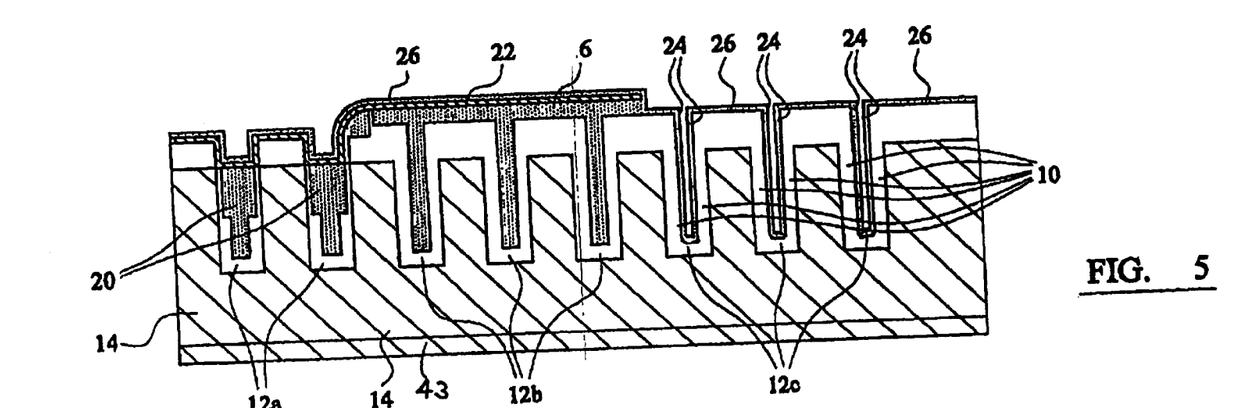
FIG. 5 shows a schematic side view of a fifth stage in the production of the first embodiment.
Figure 10:
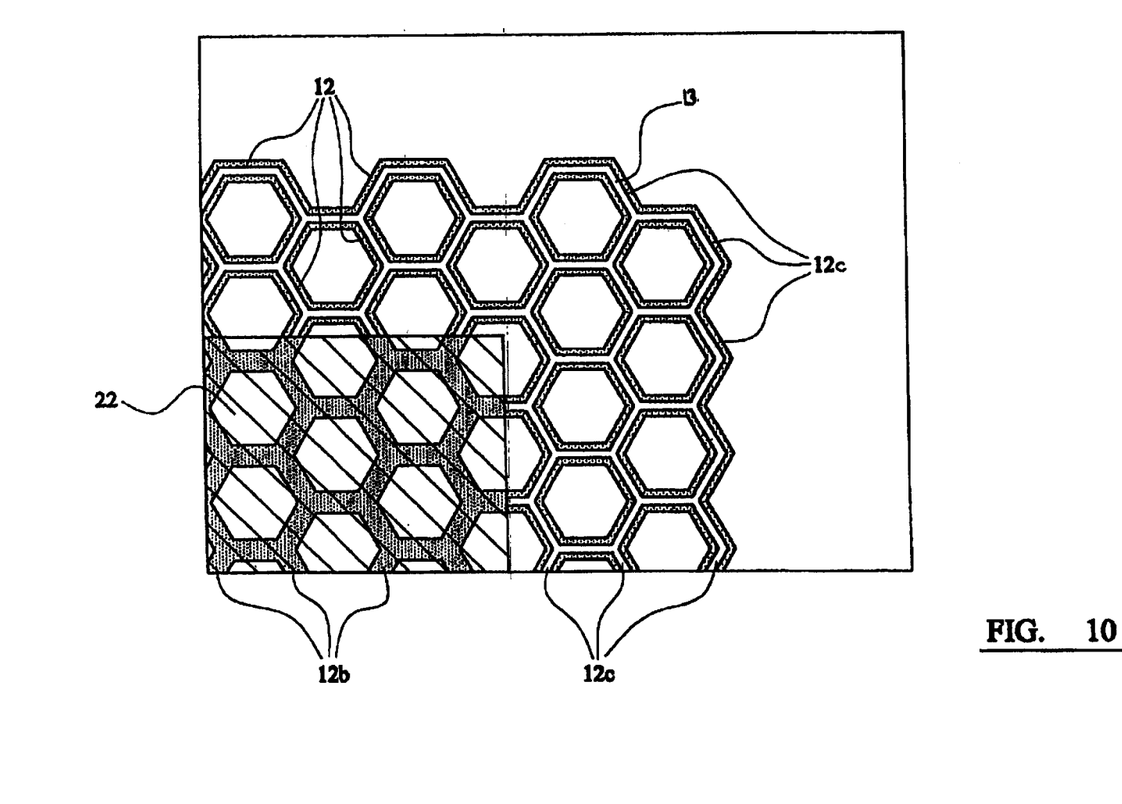
FIG. 10 is a schematic view from above showing the fifth stage in the production of the first embodiment.
Figure 11:
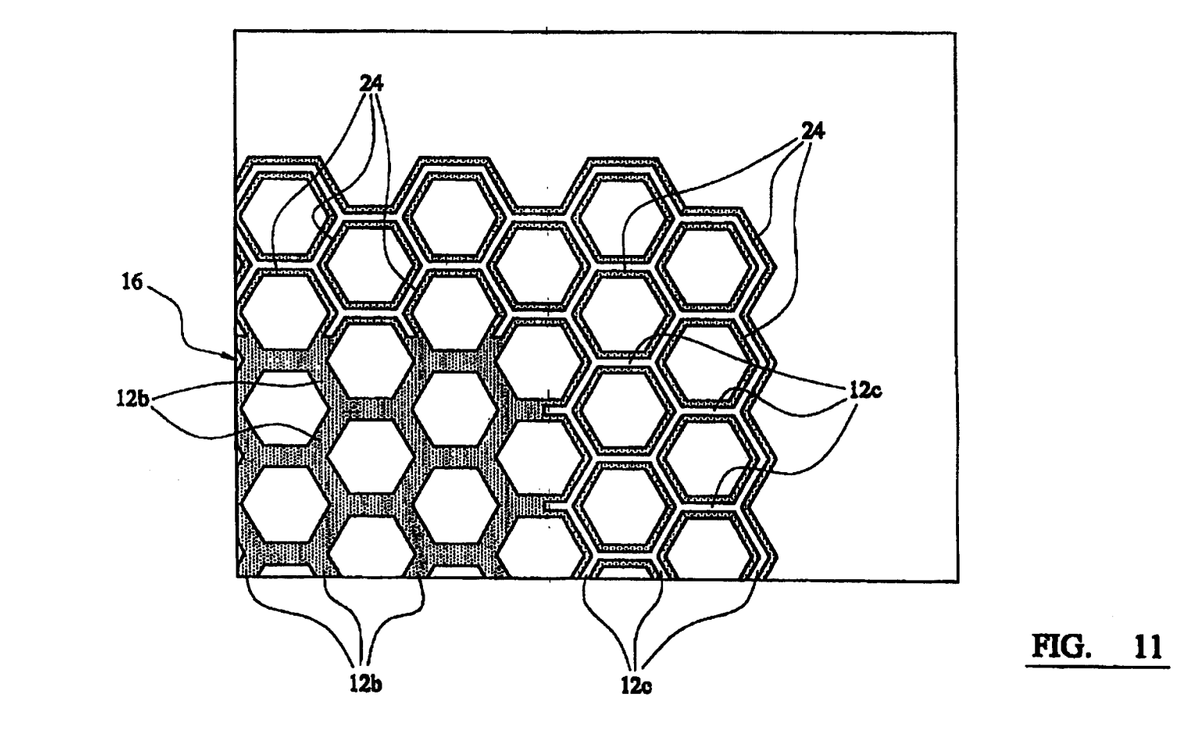
FIG. 11 is a schematic view from above showing the connection of some field plates to the gate network and some field plates left floating.

In FIG. 5, with top views being shown in FIGS. 10 and 11, it is shown that the thin nitride layer 22 has been etched back with a mask to reveal right hand trenches 12c, which form a termination or perimeter region. Then, the areas without nitride, at the edge of the device, are etched with a polysilicon etch, so in the three right hand trenches only oxide 10 remains. Thereafter, to create the field plates 24, also termed spacers, at the edge of the device, a relatively thin polysilicon layer 26 is deposited and etched anisotropically. In order to achieve the field plates 24 as shown in FIG. 5 after the etch, a relatively long etch time is necessary to make sure that the field plates do not make contact on top of the device; the top of the field plates 24 must be around the interface between the silicon 14 and the first layer of thick oxide 10. Consequently, only the field plate closest to the active area (i.e. to the left in FIG. 5) is connected to the gate trench network 12a, provided that the trench network is either formed by hexagon unit cells or by square unit cells, because these cells form closed polygons which tesselate. The field plates 24 on the right of the each of the trenches 12c are left floating.

Figure 6:
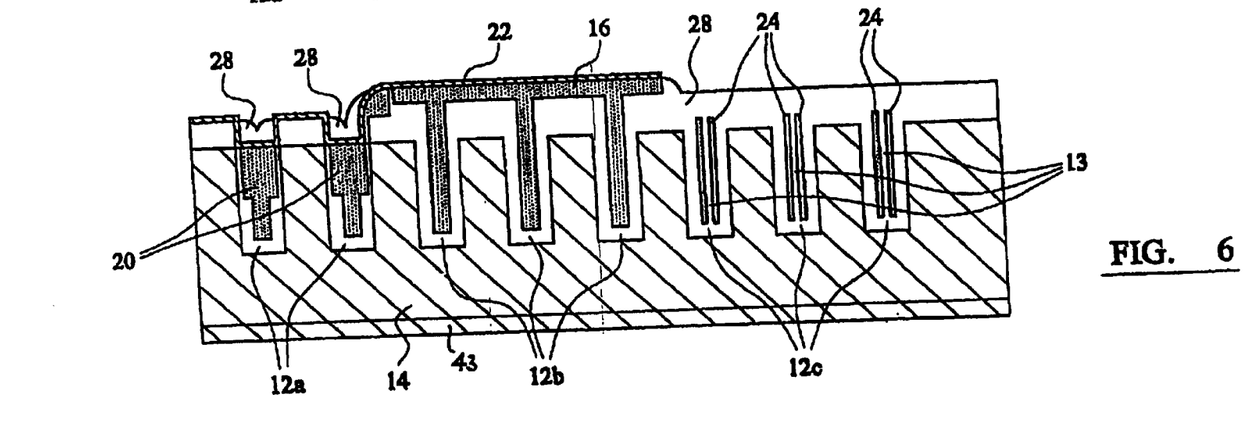
FIG. 6 shows a schematic side view of a sixth stage in the production of the first embodiment.

The next step involves deposition of a relatively thick oxide layer 28, which is then etched back down to the nitride layer 22, as shown in FIG. 6. The trenches 12 with field plates 24 are now isolated.

Figure 7:
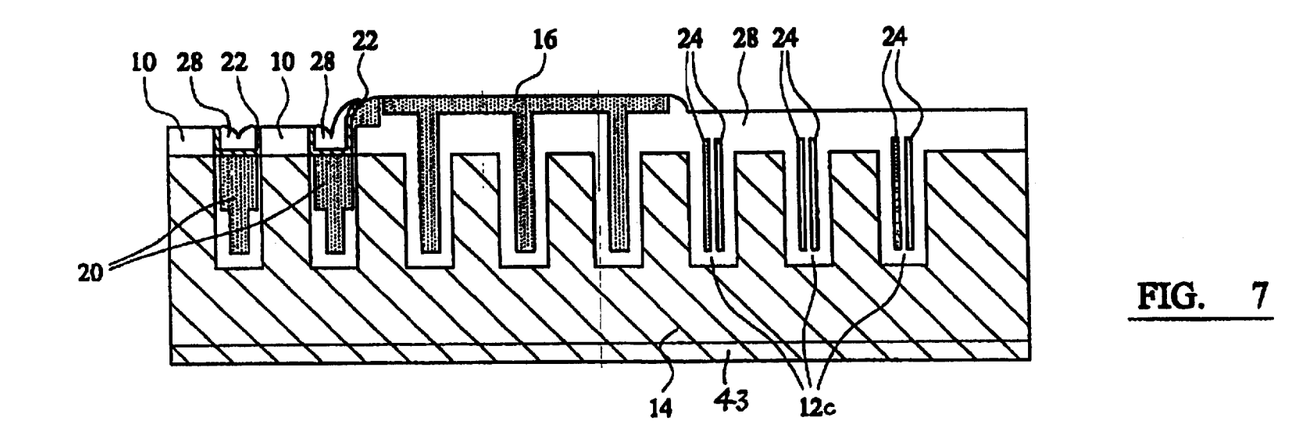
FIG. 7 show a schematic side view of a seventh stage in the production of the first embodiment.
Figure 8:
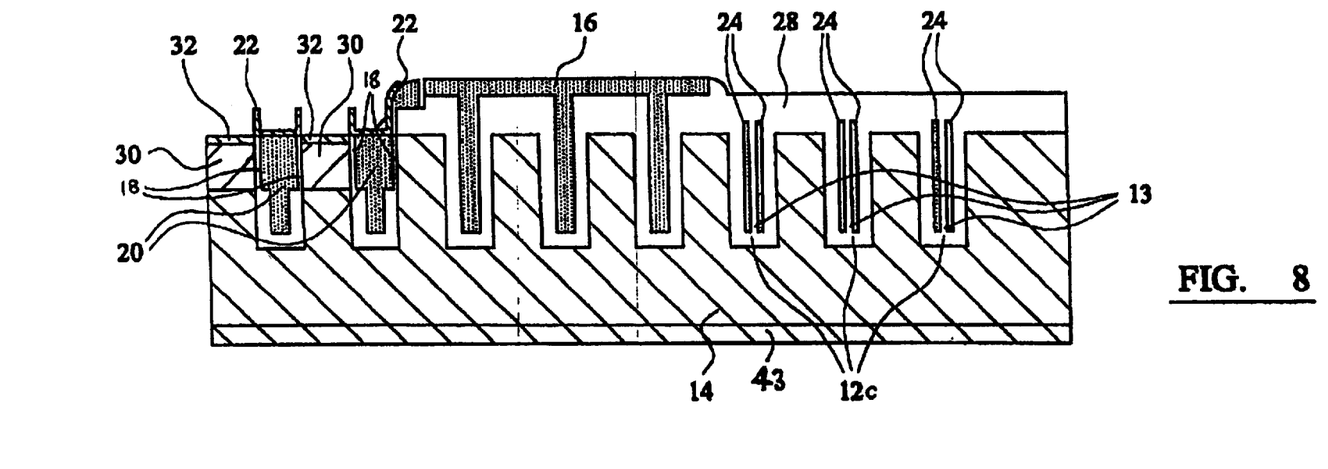
FIG. 8 shows a schematic side view of an eighth stage in the production of the first embodiment.

Subsequently, the nitride layer 22 is etched away, as shown in FIG. 7 and the oxide 10/28 is etched with a mask that defines the active area (the two left hand trenches 12a in FIGS. 1 to 8). Following that, a P-body 30 and a source 32 (see FIG. 8) are implanted and diffused in the active area.

Active cells may also be created under the polysilicon gate bondpad 16. In that case the trenches would be only of an active type (12a and b) and trenches with field plates 12c.

Further processing is the same as is described in a known self-aligned process flow; TEOS deposition, spacer etch (and bond path contact hole) to define an AP trench, AP trench etch, AP contact implantation and anneal, metalisation and patterning the metal.

In the above described embodiment, the spacing of neighbouring trenches is so close, both in the active device area and in the edge termination, that the intermediate drain drift areas are fully depleted in the off state of the device to reduce the field, known as RESURF.

The separation of the inner and outer field plates 24 is achieved by the respective location on the inner and outer wall of the termination trench 12c. This, as described above, is readily achieved in a self-aligned manner by depositing a thin conductive layer 26, in this example polysilicon, in the trench termination area and then etching it anisotropically (i.e. vertically) to remove the conductive layer 26 from the trench bottom 13, and also from the upper face of the trenched area, whilst leaving the conductive layer on the trench sidewalls 18.

Normally, the field plate trenches 12c are lined with a thicker dielectric than the gate dielectric. Also, the gate trenches 12b may be lined with this thicker dielectric.

The device structure disclosed herein and its manufacturing process are compatible with the self-aligned manufacturing method, and also a wide variety of other processes for providing the trench-gate active transistor cells.

In the manufacturing method described above, the hard mask 10 that defines the trench network is a thick oxide layer. In other processes, silicon nitride may be preferred for the mask defining the trench network. Such a modification is also possible in a method in accordance with the invention. In this modification, the hard mask 10 that defines the trench network is now a thick nitride layer. In this case, instead of a thin nitride layer 22, a thick oxide layer is deposited at the FIG. 4 stage. This oxide layer (which is thick enough to fill trench-etch windows in the thick nitride hard mask 10) is then etched back to the nitride surface of the thick nitride mask 10. The oxide remains filling the trench-etch windows in the thick nitride hard mask 10 over the active-device trenches 12a, and so it forms a capping insulator over the trench-gates 20. When etching away the oxide hard mask 10 from the active area at the FIG. 8 stage, it was necessary to mask the exposed oxide beyond the active area. However, when etching away the nitride hard mask 10 from the active area in this modified method, it is not necessary to mask the exposed oxide beyond the active area.

The particular examples described above are n-channel devices, in which source 32 and drift/drain regions 14/43 are of n-type conductivity, the region 30, is p-type, and an electron inversion channel is induced in the active region 30 by the trench-gate 20. By using opposite conductivity type dopants, a p-channel device can be manufactured by a method in accordance with the invention. In this case, the source 32 and drift/drain 14/43 regions are of p-type conductivity, the region 30 is n-type, and a hole inversion channel is induced in the active region 30 by the trench-gate 20.

Summarising these cellular trench-gate embodiments, there is provided a semiconductor device comprising active device cells in a cellular area of a semiconductor body, wherein each active device cell 12a has a channel-accommodating region 30 of a second conductivity type between a surface-adjacent source region 32 and an underlying drift/drain region 14/43 that are of a first conductivity type, an insulated gate trench 12a accommodating the trench-gate 20 extends from the source region 32 through the channel-accommodating region 30 and into the underlying drift/drain region 14/43, the trench-gate 20 being dielectrically coupled to the channel-accommodating region 30 by an intermediate gate dielectric layer 18 at sidewalls of the gate trench, and wherein there is present, beyond the active cellular area, an edge structure comprising inner and outer field plates in a termination trench structure.

From reading the present disclosure, other variations and modifications will be apparent to persons skilled in the art. Such variations and modifications may involve equivalent and other features which are already known in the manufacture of semiconductor devices and which may be used instead of or in addition to features already described herein.

The present invention may be applied to power MOSFETs of the planar DMOS type (instead of the trench-gate type), i.e. the MOS gate may be present on a dielectric layer on the body surface (instead of in a trench). It may be applied to solve similar problems in other semiconductor devices, for example bipolar transistors (instead of MOSFETs). The active device area of such devices may be cellular or not. Thus, the present invention may be used generally to provide field plates in an edge termination structure.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A cellular trench-gate field-effect transistor comprises a semiconductor body having an array of transistor cells, the cells being bounded by a pattern of perimeter trenches lined with dielectric material around the perimeter of the array, the perimeter trenches having an inner wall closer to an active area of the transistor and an outer wall closer to the edge of the transistor, wherein each of said inner and outer walls has a field plate located on the dielectric material and the field plate on the inner wall of the perimeter trenches is connected to a source or trench-gate of the transistor, and wherein the perimeter trenches include dielectric material between the field plates on the inner and outer walls.

2. A transistor as claimed in claim 1, in which each of said perimeter trenches has a field plate on said inner wall.

3. A transistor as claimed in claim 1, in which the field plates are formed of polysilicon.

4. A transistor as claimed in claim 1, in which the transistor cells and perimeter trenches are hexagon cells or square cells.

5. A transistor as claimed in claim 1, in which the inner wall field plate is connected to the trench-gate.

6. A transistor as claimed in claim 1, in which the active area extends beneath a gate bondpad of the transistor.

7. A cellular trench-gate field-effect transistor comprises a semiconductor body having an array of transistor cells, the cells being bounded by a pattern of perimeter trenches lined with dielectric material around the perimeter of the array, the perimeter trenches having an inner wall closer to an active area of the transistor and an outer wall closer to the edge of the transistor, wherein each of said inner and outer walls has a field plate located on the dielectric material and the field plate on the inner wall of the perimeter trenches is connected to a source or trench-gate of the transistor, and wherein the active area extends beneath a gate bondpad of the transistor.

* * * * *